United States Patent [19]

Serizawa et al.

[11] Patent Number: 5,311,523
[45] Date of Patent: May 10, 1994

[54] CARRIER PHASE SYNCHRONOUS TYPE MAXIMUM LIKELIHOOD DECODER

[75] Inventors: Mutsumu Serizawa, Tokyo; Junzo Murakami, Kawasaki, both of Japan

[73] Assignee: Kabushiki Kaisha Toshiba, Kanagawa, Japan

[21] Appl. No.: 446,796

[22] Filed: Dec. 6, 1989

[30] Foreign Application Priority Data

Dec. 8, 1988 [JP] Japan ............................. 63-310919

[51] Int. Cl.⁵ ...................... H03M 13/12; H03D 3/02
[52] U.S. Cl. ........................................ 371/43; 375/80
[58] Field of Search ........................ 371/43, 46, 42; 375/106, 110, 116, 118, 80; 370/100.1, 105.3, 106

[56] References Cited

U.S. PATENT DOCUMENTS

| 3,789,359 | 1/1974 | Clark, Jr. et al. | 371/46 |
| 3,872,432 | 3/1975 | Bismarck | 371/46 |

FOREIGN PATENT DOCUMENTS

| 2059724 | 4/1981 | United Kingdom | 370/105.3 |
| 2211052 | 6/1989 | United Kingdom | 371/46 |

OTHER PUBLICATIONS

*Analog-Digital Conversion-Handbook*, by The Engineering Staff of Analog Devices, Inc., Prentice-Hall, 1986, pp. 210, 211, 636-646.

Clark, G. et al., *Error-Correction Coding for Digital Communications*, Plenum Press, New York, 1981, pp. 254-265.

Dunn, J., "A 50 Mbit/s Multiplexed Coding System for Shuttle Communications", *IEEE Trans on Communications, vol. COM-26, No. 11, Nov. 1978, pp. 1636-1638.*

Clark, Jr., G. et al., *Error-Correction Coding for Digital Communications*, Plenum Press, New York, 1981, pp. 4, 5 and 254-265.

R. A. DiFazio et al., "Communication system Design Using M'ary Full and Partial Response Continuous Phase Modulation", IEEE Military Communication Conference, Oct. 1987, pp. 87-93.

P. Y. Kam, "Maximum-Likelihood Digital Data Sequence Estimation Over the Gaussian Channel with Unknown Carrier Phase", IEEE Transactions on Communications, Vo. Com-35, No. 7, Jul. 1987, pp. 764-767.

O. Macchi et al., "A Dynamic Programming Algorithm for Phase Estimation and Data Decoding on Random Phase Channels", IEEE Transactions on Information Theory, vol. IT-27, No. 5, Sep. 1991, pp. 581-595.

H. Kobayashi, "Simultaneous Adaptive Estimation and Decision Algorithm for Carrier Modulated Data Transmission Systems", IEEE Transactions on Communication Technology, vol., Com.-19, No. 3, Jun. 1971, pp. 268-280.

J. B. Thorpe et al., "A Hybrid Phasez/Data Viterbi Demodulator for Encoded CPFSK Modulation", 8089 IEEE Transactions on Communications Com-33 Jun. 1985, No. 6, pp. 535-542.

(List continued on next page.)

*Primary Examiner*—Stephen M. Baker
*Attorney, Agent, or Firm*—Finnegan, Henderson, Farabow, Garrett & Dunner

[57] ABSTRACT

A carrier phase synchronous type maximum likelihood decoder for estimating a maximum likelihood sequence of data sequence includes N memories for memorizing N partial series of data sequence; N carrier phase adjust loop, each provided correspondingly to N memories, each for adjusting a carrier phase of received data series on the basis of a partial series memorized in corresponding memory; N likelihood function calculate parts, each provided correspondingly to N memories and N carrier phase adjust parts, each for calculating likelihoods of partial series by utilizing partial series memorized in corresponding memory and an output of corresponding carrier phase adjust loop, a compare and modulation part for comparing N calculated likelihoods and for selecting partial series having a maximum likelihood from memory, thereby, the satisfactory operation in the low S/N ratio can be realized and the satisfactory phase tracking characteristics can be obtained.

2 Claims, 11 Drawing Sheets

OTHER PUBLICATIONS

Bhargava et al., "Digital Communications By Satellite," Wiley-Interscience, 1981, pp. 374-383.

Bhargava et al., "Digital Communications By Satellite," JATEC, May 21, 1986, pp. 321-329, 446.

Forney, Jr., "The Viterbi Algorithm", IEEE, vol. 61, No. 3, Mar. 1973, pp. 268-278.

G. Ungerboeck, "New Application for the Viterbi Algorithm: Carrier-Phase Tracking in Synchronous Data-Transmission Systems," *IEEE Proc. NTC* 1974, pp. 734-738.

Thorpe et al., "A Hybrid Phase/Data Viterbi Demodulator for Encoded CPFSK Modulation," *IEEE Transactions on Communications,* vol. Com-33, No. 6, Jun. 1985, pp. 535-542.

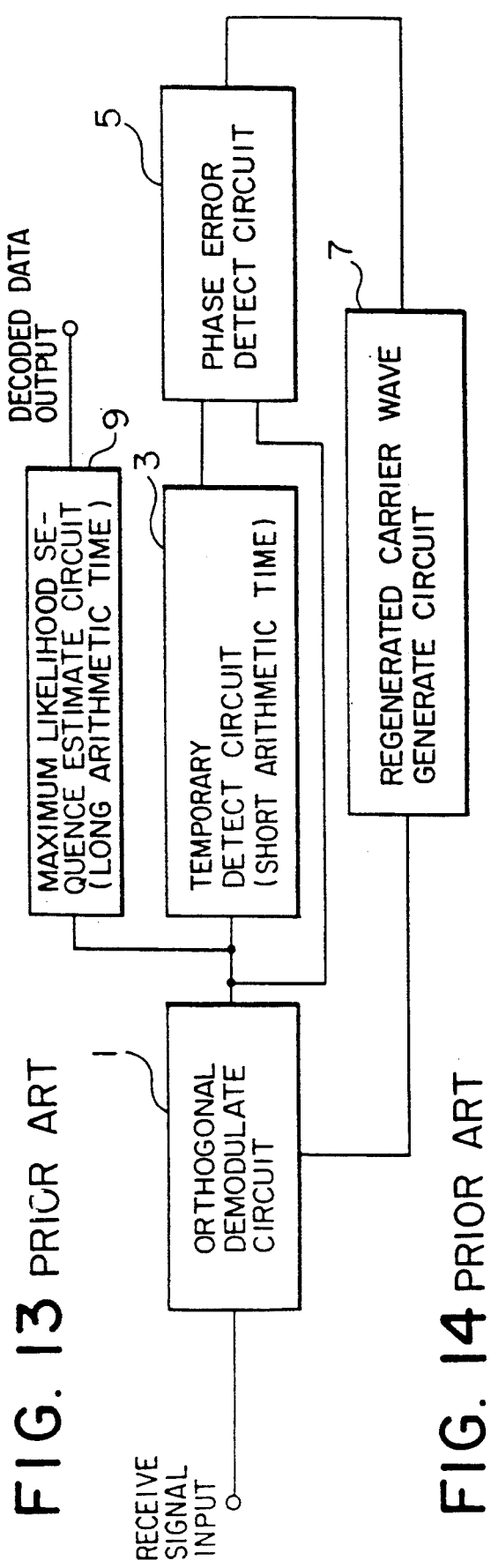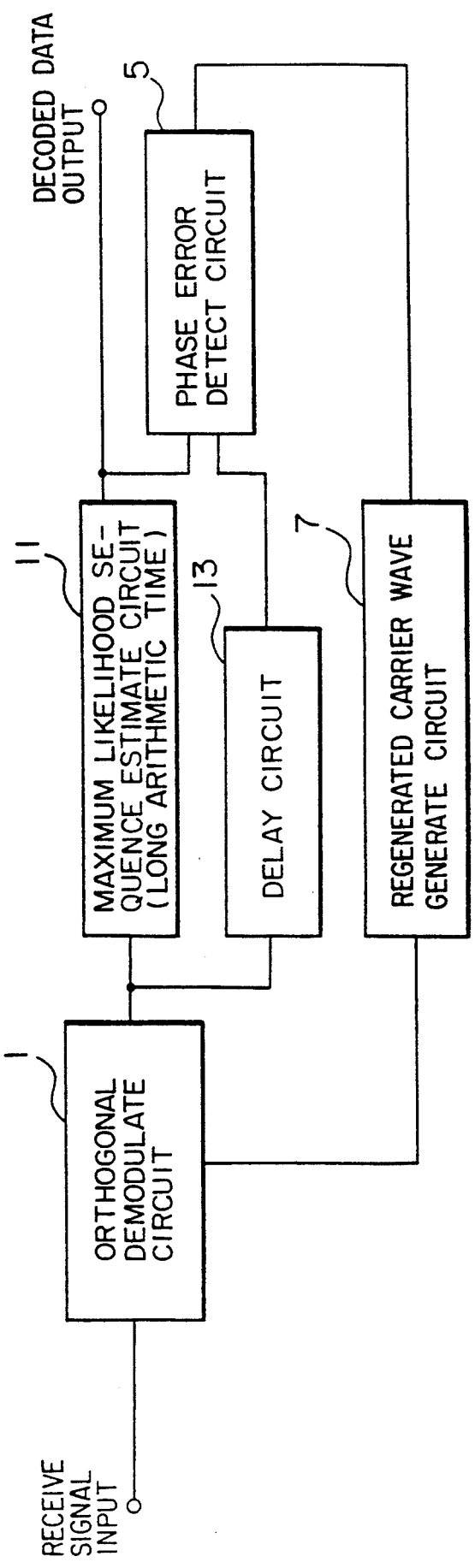

CARRIER PHASE SYNCHRONOUS TYPE MAXIMUM LIKELIHOOD DECODER

BACKGROUND OF THE INVENTION

1. Field of the Invention

The present invention relates to a detection and determination of data within a range having a low signal-to-noise ratio (referred to as a S/N ratio hereinafter) in a communication or a recording device etc., and more particularly, relates to a carrier phase synchronous type maximum likelihood decoder for transmitting and receiving digital signals.

2. Description of the Related Art

In recent years, it has been noticed the receiving system in which modulation signals, in a broad sense, involving the phase modulation of convolutionally encoded data, an orthogonal amplitude modulation, an encoded modulation, CPFSK and a modulation having an interference between the symbols, are detected with Maximum Likelihood Sequence Estimation Scheme, because it provides the satisfactory S/N ratio against error rate characteristics.

The maximum likelihood sequence estimation system as mentioned above, is structured to estimate a transmit data sequence with a minimum error on the basis of reference signals which are hypothetical ideally detected signals.

Since the maximum likelihood estimation system has the advantage that the remarkable low error rate can be expected in the low S/N ratio range which the other system cannot achieve, it has been considered widely in various fields.

The demodulation means is required to have a low error rate in such low S/N ratio. To carry out a maximum likelihood decode, coherent detection means which has good error rate characteristics is utilized.

FIG. 13 is a block diagram showing the structure of the phase synchronous circuit used in such a synchronous detection system. As shown in the drawing, the phase synchronous circuit includes an orthogonal demodulate circuit 1, a temporary detect circuit 3, a phase error detect circuit 5, a regenerated carrier wave generate circuit 7 and a maximum likelihood sequence estimate circuit 9.

The orthogonal demodulate circuit 1 demodulates orthogonally the received signals. The temporary detect circuit 3 detects the transmitted data with immediate detection scheme. The phase error detect circuit 5 detects the phase error between the output of the orthogonal demodulation circuit 1 and the output of the temporary determine circuit 3.

The regenerated carrier wave generate circuit 7 generates the regenerated carrier wave controlled by the output of the phase error detect circuit 5. The maximum likelihood sequence estimate circuit 9 estimates the transmit signal with maximum likelihood on the basis of the output signal of the orthogonal demodulation circuit 1.

In the phase synchronous circuit as mentioned above, the phase error between the regenerated carrier wave and the carrier wave of receive signal is calculated and the phase of the regenerated carrier wave is controlled based on the phase error. This loop does not contain a long delay, and shows good tracking performance in high SN ratio condition.

However, in such a phase synchronous loop, when "the output of temporary detect circuit" is not correct, the incorrect phase error is calculated and the phase of regenerated carrier wave is controlled on the basis of the incorrect phase error, therefore, the synchronization cannot be achieved well, especially in low SN ratio condition. The phase error calculated on the basis of the correct transmit data is the error where a Gaussian random noise is added to the real phase error. Therefore, the noise component can be removed by means of a linear filter, if the phase movement of the carrier wave is within a certain range. On the contrary, since the phase error calculated on the basis of the incorrect transmitted data has not only the Gaussian random noise added to the real phase error, but also the incorrect error based on the erroneous detection, which acts as a nonlinear noise, it is difficult to hold the synchronization when the error exceeds a certain range. Further, it is very difficult to synchronize when the phase of transmit carrier wave changes fastly, for example by fading.

Since the phase error is calculated on the basis of the temporary detected data involving larger amount of errors than the maximum likelihood sequence, the sufficient operation cannot be carried out in a low S/N ratio. As a result, it is not possible to obtain good error rate performance in a low S/N ratio.

FIG. 14 is a block diagram showing the structure of another phase synchronous circuit. This phase synchronous circuit includes an orthogonal demodulate circuit 1, a maximum likelihood sequence estimate circuit 11, a delay circuit 13, a phase error detect circuit 5 and a regenerated carrier wave generate circuit 7.

The delay circuit 13 delays an output signal of the orthogonal demodulate circuit 1. The maximum likelihood sequence estimate circuit 11 estimates the maximum likelihood sequence of the transmit signal on the basis of the output signal from the orthogonal circuit 1. The phase error detect circuit 5 detects the phase errors between the outputs of the delay circuit 13 and the Maximum likelihood sequence estimate circuit 11. The regenerated carrier wave generate circuit 7 generates the regenerated carrier wave on the basis of the output from the phase error detect circuit 5.

In the phase synchronous circuit as mentioned above, the phase error is calculated by the phase error detect circuit 5 on the basis of the output of the maximum likelihood sequence estimate circuit 11. The most reliable phase errors can be calculated by the system described above.

However, for determining the maximum likelihood of the transmit data, it takes a quite long time.

Further, the time for decoding is taken longer in some case. For example, in decoding such punctured convolution data of the 7/8 encode rate, it takes in general the time nearly ten times as much as the constrained length. The circuit for adjusting the regenerated carrier wave by utilizing the phase error calculated on the basis of the transmit data determined in a long period of time has the remarkably large delay time in the control loop, therefore, it is impossible to attain a good characteristics in the phase tracking. Namely, the circuit has disadvantages that a frequency tracking range becomes remarkably narrow, a loop becomes easily unstable and a time required for the synchronization is taken remarkably long.

In the phase synchronization circuit, the delay in the loop becomes longer, the sufficient phase tracking characteristics cannot be obtained. Therefore, the synchronization failure in the loop is caused if phase of the carrier wave varies even slightly. As a result, it is not possible to obtain good error rate performance.

As described above, it is hard to carry out the maximum likelihood sequence estimation and achieve the phase synchronization of signals having the large Inter-Symbol-Interference simultaneously. Moreover, the phase synchronization in the low S/N ratio is remarkably hard to obtain. Further, when the maximum likelihood sequence estimation system is used in the satellite mobile communication and the land mobile communication, it is hard to obtain the carrier phase synchronization, because the carrier phase is remarkably fluctuated by the complicated transmission path characteristics, such as a multipath fading and a shadowing. Further, the ratio of whole signals occupied by the preamble or the pilot is remarkably high, therefore, it is difficult to utilize the frequency band efficiently.

SUMMARY OF THE INVENTION

As described above, there has not been provided such a carrier phase synchronous means which operates satisfactorily in the low S/N ratio, which has a satisfactory carrier phase tracking characteristics, and which is suitable for the maximum likelihood sequence estimation. Therefore, there has been the problem that the maximum likelihood sequence estimation, which has various advantages, cannot be achieved in the range of the low S/N ratio.

The present invention has been done in view of the disadvantages as mentioned above, and aims at providing a carrier phase synchronous type maximum likelihood decode system which is capable of operating satisfactorily in the low S/N ratio and providing satisfactory carrier phase tracking characteristics.

For achieving the object as mentioned above, a carrier phase synchronous type maximum likelihood decoder is provided that estimates a maximum likelihood sequence of data sequence, said data sequence being transmitted from a transmit side, N (N is a positive integer) memory means for memorizing N partial series of said data sequence; N carrier phase adjust means, each provided correspondingly to said N memory means, each for adjusting a carrier phase of received data series on the basis of a partial series memorized in said corresponding memory means; N means, each provided correspondingly to said N memory means and said N carrier phase adjust means, each for calculating likelihoods of partial series by utilizing said partial series memorized in said corresponding memory means and an output of said corresponding phase adjust means, means for comparing N calculated likelihoods and for selecting partial series having a maximum likelihood from said memory means.

By the present invention, the carrier phase synchronous type maximum likelihood sequence system operates satisfactorily in a low S/N ratio and has a satisfactory carrier phase tracking characteristics.

BRIEF DESCRIPTION OF THE DRAWINGS

FIGS. 13 and 14 block diagrams showing the structure of the conventional phase synchronous circuits.

DESCRIPTION OF THE PREFERRED EMBODIMENT

Now, an embodiment of the present invention will be explained below in detail with reference to the drawings.

Figure 1:
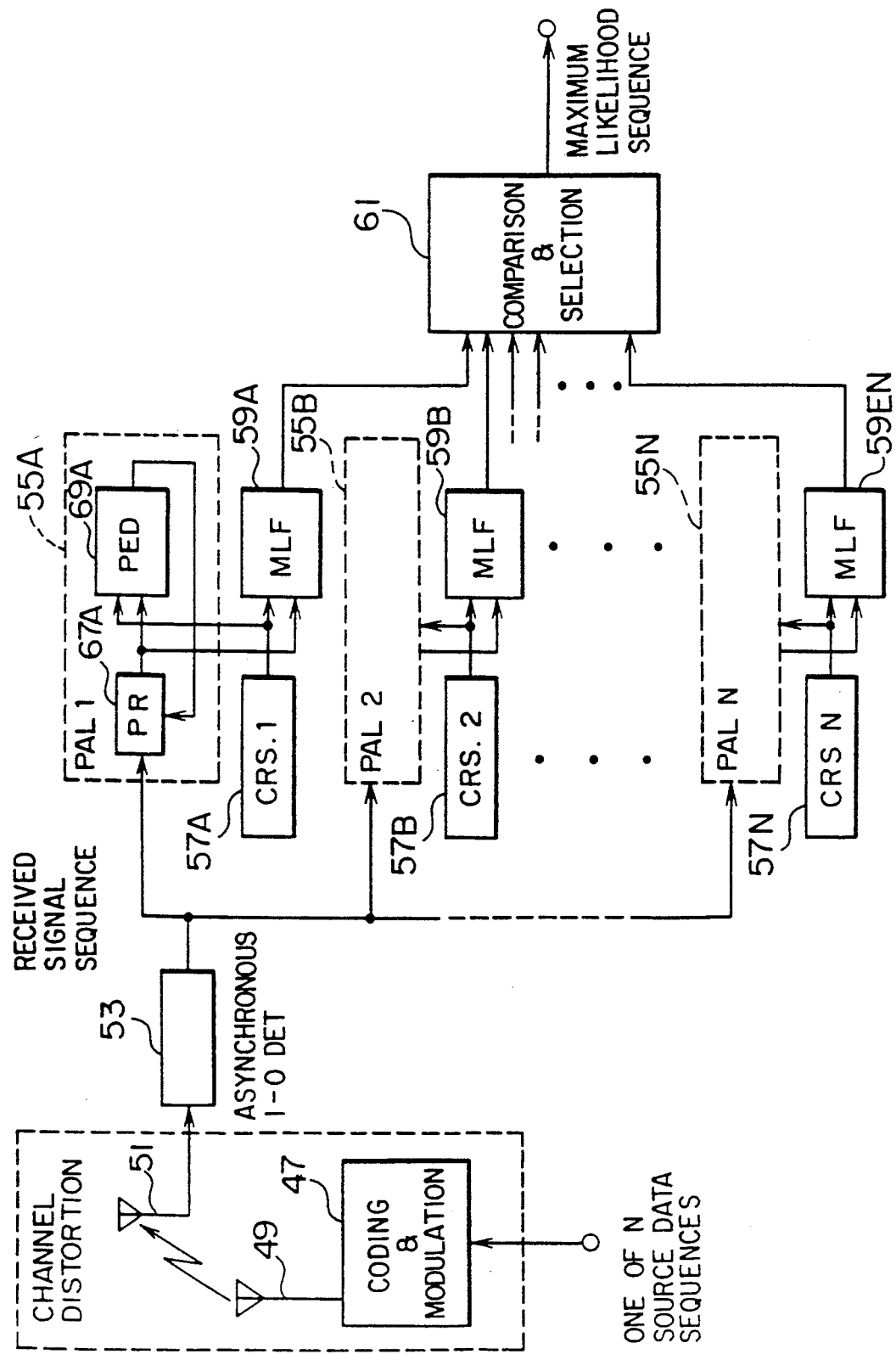
FIG. 1 is a block diagram showing the structure of a phase synchronous type maximum likelihood decoder according to an embodiment of the present invention.

FIG. 1 is a block diagram showing the structure of a phase synchronous maximum likelihood decoder according to the first invention.

As shown in the figure, a carrier phase synchronous type maximum likelihood decoder includes an antenna 51, a quasi synchronous detect part (an orthogonal detect part by synchronous carrier) 53, carrier phase adjusting loops 55A, 5B, - - -, and 55N, signal series memory parts 57A, 57B, - - -, and 57N, likelihood function calculate parts 59A, 59B, - - -, and 59N, and a compare and select part 61.

A coding and modulation part 47 and an antenna 49 are provided in the transmit side.

One of N partial series in the transmit series is input into the coding and modulation part 47 and is transmitted to the receive side through the antenna 49.

The quasi synchronous detect part 53 orthogonally demodulates the signal series received in the receive side antenna 51 by using the asynchronous carrier.

The carrier phase adjusting loop 55A includes a carrier phase shifter 67A and a carrier phase error detector 69A. Each signal series memory part 57A-57N memorizes N partial series of the transmit data series possibly transmitted from the transmit side.

The carrier phase adjusting loops 55A-55N adjust a residual carrier phase of the quasi synchronous detect part 53 output, on the basis of the partial series memorized in each signal series memory part 57A-57N.

The likelihood function calculate parts 59A-59N calculate the likelihood of the partial series on the basis of the partial series memorized in each signal series memory part 57A-57N and the output from the phase adjusting loops 55A-55N.

The compare and select part 61 compares the calculated N likelihoods and selects the partial series having the maximum likelihood.

Next, the operation of the present embodiment will be explained. First, the maximum likelihood sequence estimation will be explained. In the maximum likelihood sequence estimation, when a signal is received, one partial series with the highest probability of transmission (likelihood) among the possibly transmitted partial series, is searched. It is determined that the partial series having the highest probability has transmitted.

Namely, in the maximum likelihood sequence estimation every likelihood of the possibly transmitted signal series is calculated, then, the transmit signal having the maximum likelihood is selected among these calculated likelihoods When the receive signal is input, if the phase synchronization between the carrier wave of the receive signal and the regenerated carrier wave are completed, the likelihood can be determined.

However, the phase synchronization between the carrier wave of the receive signal and the regenerated carrier wave is not actually achieved. This invention provides a novel receiver where the maximum likelihood sequence estimation and carrier phase synchronization can be carried out simultaneously. In another word, by this invention, MLSE can be carried out based on received signal sequence which are demodulated with asynchronous carrier.

The N possibly transmitted data series can be hypothesized. These N data series are memorized in memories 57A, B, ..., and the phase error series are determined in phase error detect parts 69A, B, ...

If there is a certain limitation in the movement of the received signal carrier phase the phase of regenerated carrier which minimizes the phase error can be hypothesized when the series of the phase error is determined. When the movement of the phase of carrier wave is hypothesized, the likelihood, regarding the case in which all the possibly transmitted signals are assumed to be transmitted, is calculated by the likelihood function calculate parts 59A, 59B - - - . When the likelihood regarding the possibly transmitted data is calculated, the maximum likelihood is selected by the compare and select part 61. And it is estimated which series has the highest possibility to be transmitted among the possibly transmitted signal series for he received signals. As a result, MLSE can be completed. Further, the received signal carrier phase in the receive signals is also determined.

Figure 2:
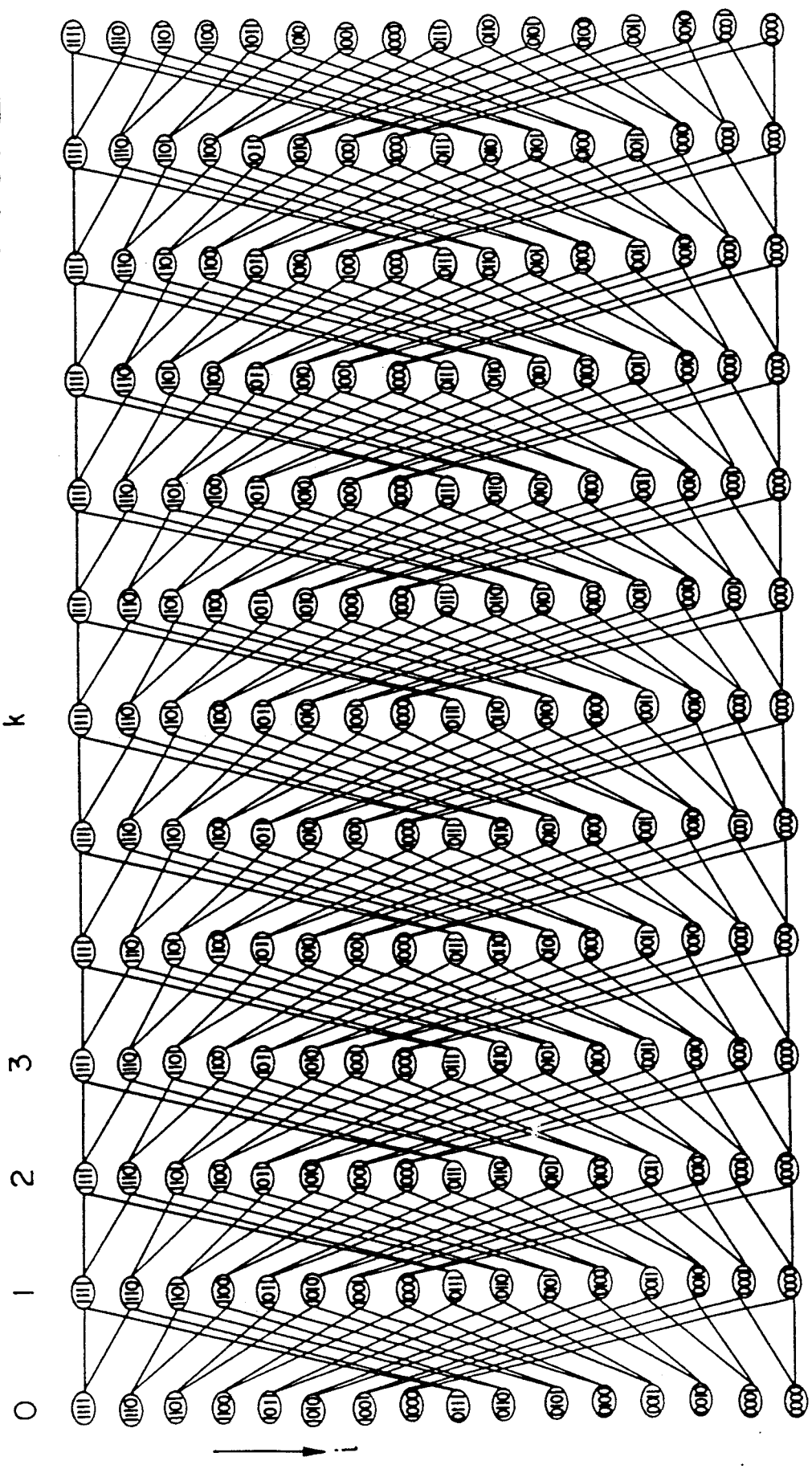
FIG. 2 is a transition diagram showing a state in the Viterbi algorithm.

Next, an embodiment of the carrier phase synchronous maximum likelihood decoder in which the Viterbi algorithm is used will be explained. FIG. 2 is a transition diagram showing the state in the Viterbi algorithm. The time is shown in a horizontal direction, and the state is shown in the vertical direction. There are 16 states, such as [1111], 1110], . . . [0000] in the time k.

The numeric value indicated in each state (for example 1111]) shows the partial series of the possibly transmitted data series from the transmit side.

The Viterbi algorithm is described in detail in "New Digital Satellite Communication" by JATECH Publications March 973, and "VIJAY" by K. BHARGAVE, and also in "The Viterbi Algorithm" by G. David FORNEY, Jr., "Proceedings of the IEEF vol 61 No. 3.

Figure 3:
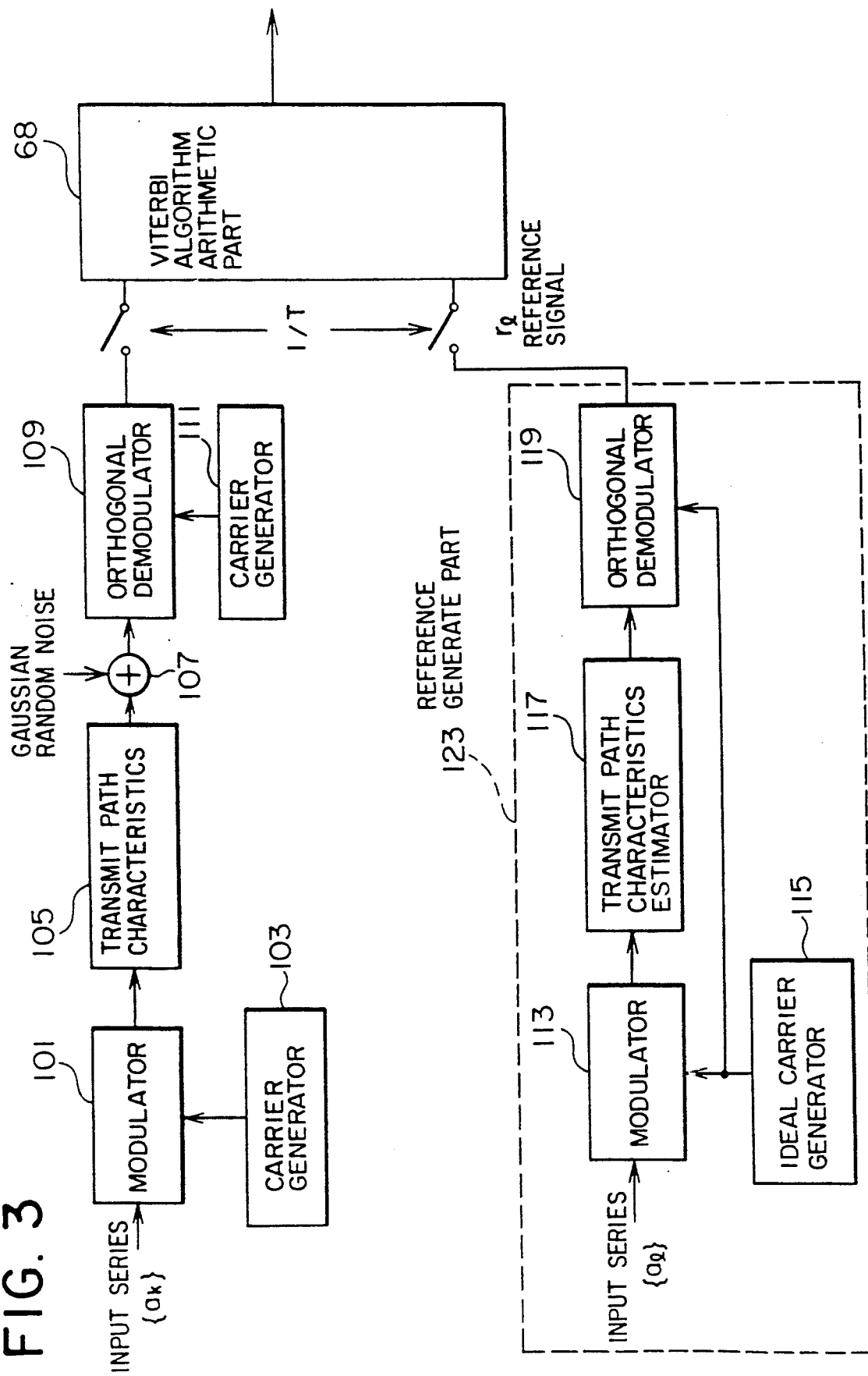
FIG. 3 is a block diagram showing the structure of a receive system involving the maximum likelihood decoder.

FIG. 3 is a block diagram showing the structure of the receive system applied to an embodiment using the Viterbi algorithm.

As shown in the figure, this receive system includes a modulator 101, a carrier generator 103, a transmission path characteristics 105, an adder 107, an orthogonal demodulator 109, a carrier generator 111, a modulator 113, an ideal carrier generator 115, a transmission path characteristics estimator 117, an orthogonal demodulator 119 and a Viterbi algorithm arithmetic part 68.

A reference signal generate part 123 includes the modulator 113, the ideal carrier generator 115, the transmission path characteristics estimator 117 and the orthogonal demodulator 119.

The modulator 101 modulates an input series (a k), which is the transmit data series, by using the carrier from the carrier generator 103.

The carrier generator 103 supplies the carrier to the modulator 101. The transmission path characteristics 105 influences the transmission characteristics to the output signal of the modulator 101, for example, the frequency selective fading is mixed to the output signal of the modulator 101. The adder 107 adds the Gaussian random noise to the output signal of the transmission path characteristics 05. The orthogonal demodulator 109 demodulates the output signal of the adder 107 by using the asynchronous carrier generated in the carrier generator 111. The carrier generator 11 generates the asynchronous carrier which is not synchronized to the carrier generated by the carrier generator 03.

The modulator 113 modulates an input series (a M), which is the transmit data series, by using an ideal carrier of the deal carrier generator 115.

The ideal carrier generator 115 supplies the ideal carrier to the modulator 113. The transmission path characteristics estimator 117 gives the transmission characteristics, for example a frequency selective fading, to he output signal of the modulator 113. The orthogonal demodulator 119 demodulates the output signal of the transmit path characteristic artificial part 117 by using the ideal carrier generated from the ideal carrier generator 115 and outputs the reference signal r.

Figure 4:
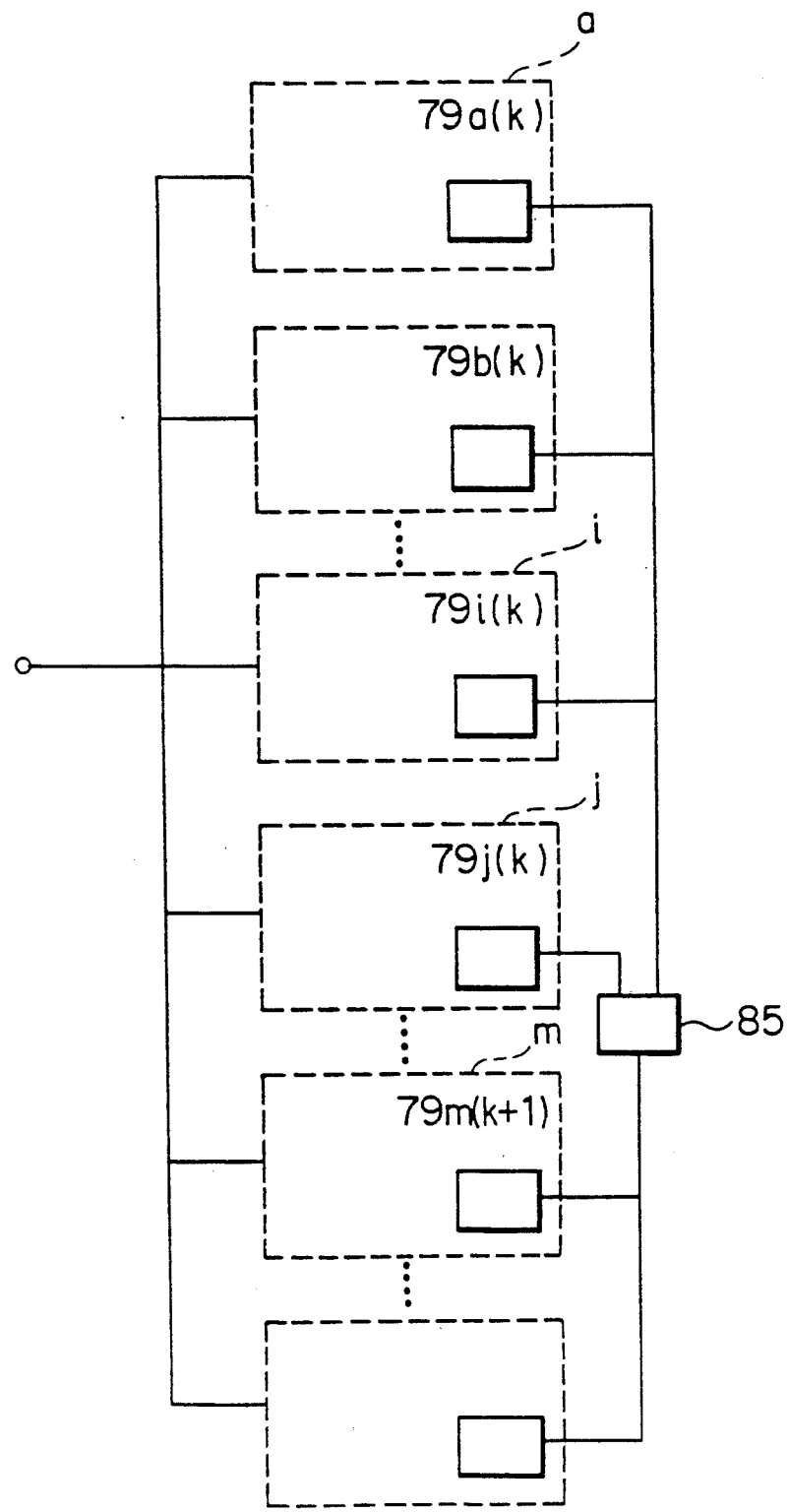
FIG. 4 is a block diagram showing schematically the structure of a Viterbi algorithm arithmetic part 68 in FIG. 3.
Figure 5:
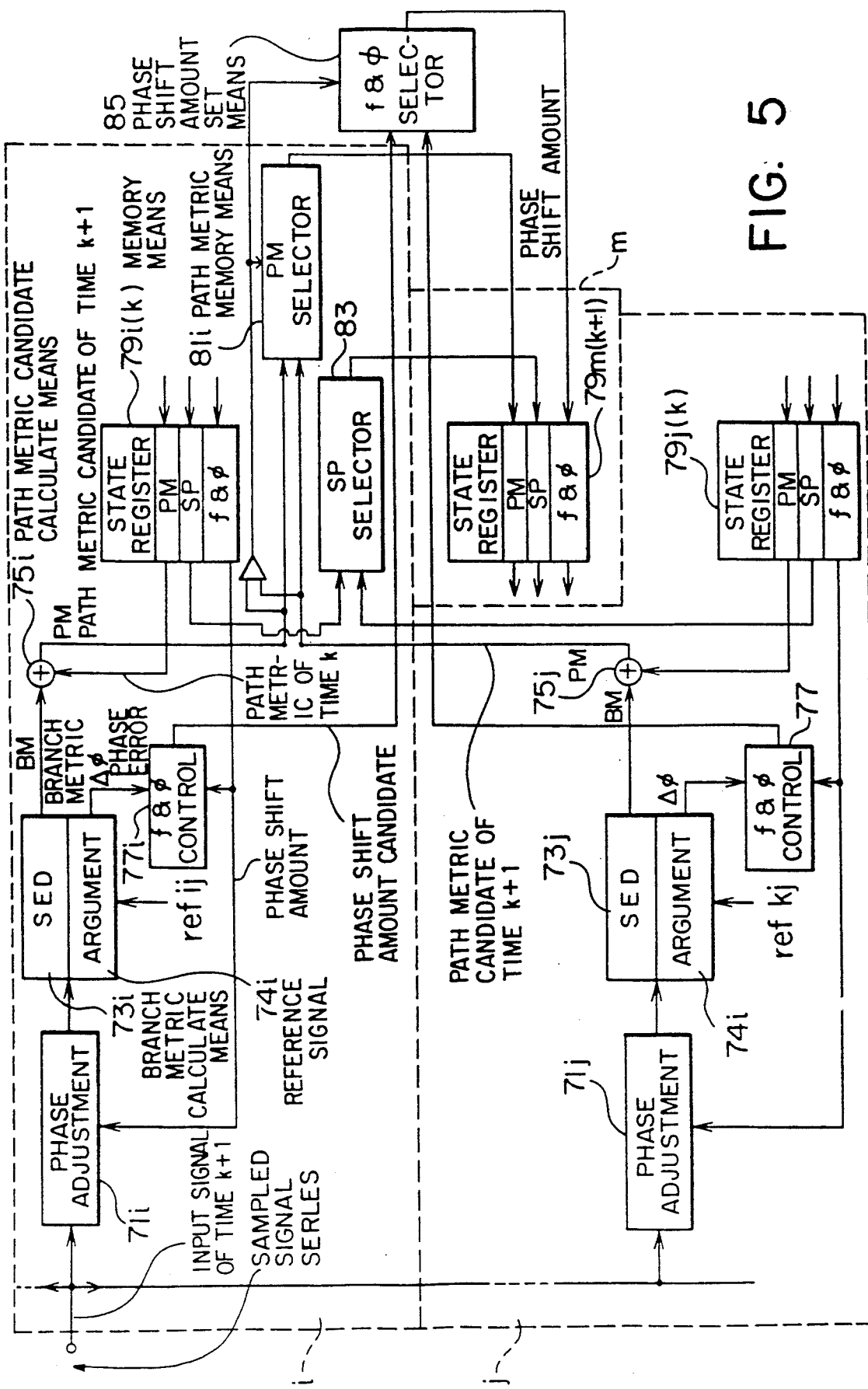
FIG. 5 is a block diagram showing the structure of the Viterbi algorithm arithmetic part 68 in FIG. 3.

FIG. 4 is a block diagram schematically showing the structure of the Viterbi algorithm arithmetic part 68. FIG. 5 is a block diagram showing in detail the structure of the Viterbi algorithm arithmetic part 68.

Namely, FIG. 5 shows the structure of the device in the state i and the state j, and the state memory 79 in the state m in FIG. 4.

The structures of the device in the state i (i=1 to 16) are all similar to each other.

The Viterbi algorithm arithmetic part 68 includes a carrier phase adjusting part 71$i$ (i=1, - - - , 16), a branch metric calculate part 73$i$, an adder 75$i$ as a path metric candidate calculate means, a carrier phase shift amount candidate calculate part 77$i$, a state memory 79$i$ as a memory means, a path metric selector 81$i$, a selected path selector 83$i$ and f & d selector 85$i$ as a carrier phase shift amount select means.

The carrier phase adjusting part 71$i$ shifts the carrier phase of the input signal of time (k+1) by the carrier phase shift amount of the time k memorized in the state memory 79$i$.

The branch metric calculating part 73$i$ calculates the branch metric BM by evaluating the difference between the output signal of the phase adjusting path 71$i$ and the reference signal ref which is a vector corresponding to a transition from time k to time (k+1) in the state i.

The carrier phase error calculating part 74$i$ calculates the carrier phase error which is the angle difference between the output signal from the phase adjusting part 71$i$ in the state i and the reference signal r$_{ef}$.

The adder 75$i$ as the path metric candidate calculate means calculates a path metric candidates PM in the state i of the time (k+1) by adding the path metric PM, which is in the state i of time k, to the branch metric BM from the branch metric calculate part 73$i$.

The carrier phase shift amount candidate calculate part 77$i$ calculates a carrier phase shift amount information candidates f & d from state i to state m, by using the carrier phase shift amount information candidate f & d in state i of time k, memorized in the state memory 79i, and the output signal of the carrier phase error calculating part 74i.

The state memory 79i as the memory means memorizes, the path metric PM in the state i of time k, the selected path SP, and the phase shift amount information f & d.

The path metric selector 81 as the path metric select means compares a pair of path metric candidates PM calculated in the adder 75i and 75j in accordance with the transition from the state i of the time k and the state j of the time k to the state m of the time (k+1), and selects the path metric of the state m of the time (k+1).

The selected path selector 83 selects the path. The carrier phase shift amount information select part 85i selects the carrier phase shift amount information candidate f & d corresponding to the selected transition when one transition between from the state i of the time k to the state j of the time (k+1) and from the state j of the time k to the state j of the time (K+1) is selected by the path metric selector 81. The carrier phase shift amount select part 85i writes it in the state memory 79m in the state m of the time (k+1).

For example, if the transition from the state i of time k to the state m of time (k+1) is selected, the carrier phase shift amount information candidate f & d corresponding to the selected transition is selected and written in the state memory 79m in the state m of the time (k+1).

Next, the operation of the Viterbi algorithm arithmetic part 68 will be explained.

In the Viterbi algorithm, the constant number of the remaining path and the path metric corresponding to each path re sequentially updated to estimate the transmit series having the maximum likelihood.

The carrier phase control of each regenerated carrier wave is carried out in accordance with the proper phase error of each remaining path by assuming each remaining path has a generated carrier wave (a carrier phase adjusting loop, a carrier phase shift amount). Namely, each remaining path has the proper transmit data series, so, it has the proper carrier phase error series. Therefore, the Viterbi algorithm arithmetic part 68 synchronizes the carrier wave independently to each remaining path on the basis of the proper carrier phase error series of the remaining path. Namely, the calculation for the branch metric is carried out on the basis of the carrier phase of regenerated carrier wave presumed by the carrier phase synchronizing loop corresponding to the remaining path to the state as the origin of the branch.

The reference signal $r_{ef}$ used for calculating a branch metric BM is a vector in the complex plane phase-shifted by a carrier phase shift amount information f & d which is memorized in accordance with a state which is the origin of a transition. The transition is calculated by using the reference signal $r_{ef}$. The vector is determined by the transmit data according to a state i which is the origin of the transition. A carrier phase shift amount information candidate value f & d is a carrier phase shift amount information f & d amended by using a carrier phase error Dd.

The carrier phase shift amount information f & d is memorized corresponding to a state which is an origin of each transition. The carrier phase error D r is an angle difference between an input signal and the reference signal $r_{ef}$. When one of path metric candidates is selected, the corresponding carrier phase shift amount candidates is selected. f is regenerated carrier frequency, and d is the regenerated carrier phase.

For example, when two transitions from the states i and j of time k to the state m of time (k+1) are considered, a pair of branch metrics to one state are calculated and added to the path metric of the origin of each branch to compare, and then, one of them is selected as the remaining path.

Namely, the path metric candidate PM from the state i of time k to the state m of time (k+1) is calculated by means of the adder 75i.

And the path metric candidate PM from the state j of time k to the state m of time (k+1) is calculated by means of the adder 75j.

The path metric setting part 81i compares a pair of path metric candidates PM and selects one of them.

Simultaneously, the regenerated carrier wave (carrier phase shift amount) corresponding to the selected path is selected.

For example, when the path metric from the state i in the time k to the state m in the time (k+1) is selected by the path metric select part 81i, the phase shift amount information select part 85i selects the phase shift amount information candidate f & d from the state i in the time k to he state m in the time (k+1).

Further, the phase of the regenerated carrier wave (a carrier phase shift amount) being as the origin of the elected branch is controlled by using the carrier phase error signal calculated from the receive signal on the basis of the transmit signal corresponding to the selected signal, and the regenerated carrier wave (phase shift amount) corresponding to he remaining path is updated.

As mentioned above, the synchronization of the carrier phase is carried out, obtaining the maximum likelihood sequence estimated data.

Namely, the carrier phase shift amount which is the supposed regenerated carrier wave relating to the path finally selected at the maximum likelihood is controlled by the carrier phase error calculated on the basis of data estimated with maximum likelihood.

Further, since the carrier phase shift amount is controlled by the carrier phase error calculated on the basis of the proper transmit data of the path every time the path metric is updated, the delay in the loop is not caused.

Next, the algorithm in the receive system shown in FIG. 3 will be explained.

In the receive system, the maximum likelihood sequence of the input series ($a_k$) as the transmit data series is performed from the demodulated output signal ($z_k$) by the asynchronous carrier.

To estimate the input series (a k), following three matters are supposed.

1) The clock frequency (1/T) in the transmit side and the receive side are corresponded each other (phase shift is taken in the transmission path characteristics).

2) The operative characteristics of the modulator and the impulse response of the transmission path (including the transmit and receive filter) is already known. The reference signal series ($r_k$) is obtained on supplying the input series $a_k$).

3) In the input series ($a_k$), there are $a_{k-n}$, $a_{k-n+1}$, - - -, $a_k$ affecting the demodulated output signal $z_k$. The affection is an interference among the codes by the characteristics of the modulator and the impulse response of the transmission media.

There are M (=Ln) partial series whose length is n (L designates the level number of the input signal). The M partial series is called the "state". The parameter $x_k$ designates what state of M state is in the time k. The relation to the input series can be defined as follows:

$$x_k=(a_{k-n}, a_{k-n+1}, \cdots a_{k-1})$$

Further, the change, (for example, the state $x_k$ in the time k moves to the state $x_{k+1}$ in the time k+1,) is called the "transition", and it can be expressed as follows:

$$u_k(x_{k+1}, z_k),$$

and $u_k$ can be expressed as follows:

$$u_k(a_{k-n}, a_{k-n+1}, \cdots, a_{k-1}, a_k)$$

The time series $(u_k)$ of the transition and the time series $(x_k)$ of the state are corresponding to each other. And the time series $(x_k)$ of the state and the input series $(a_k)$ are corresponding to each other. Therefore, the time series $(u_k)$ of the transition or the time series $(x_k)$ of the state can be presumed in stead of presuming the input series $(a_k)$ Here, the time series $(x_k)$ of the state (so called, the "path") is presumed considering to a state trellis when the number of state is M $(=L^n)$.

Next, the actual operation of the algorithm to estimate the maximum likelihood of the input series $(a_k)$ from the demodulated output signal $(z_k)$ will be explained.

The carrier phase adjusting loop (PAL) having same number as the state number M is provided independently. And the PAL is accorded to each remaining path (there is one in each state and is totally M). In each PAL, the carrier phase of the origin signal $(r_k)$ which is adjusted by the output phase of the PAL when supposing an input series is transmitted, follows the carrier phase of the receive signal. Then, the carrier phase of the origin signal $(r_k)$ used for calculating the branch metric is adjusted in every branch by using this.

In this algorithm, the orthogonally demodulated output signal $(z_k)$ is supplied as the input signal, and the origin signal $(r_k)$ is supplied as the reference signal.

Here, the characters in this algorithm are redefined as follows:

| | | |
|---|---|---|
| k | ; | time |
| $x(x_k), 1 \leq x_k \leq M$; | | remaining path wherein $(x_k)$ is its terminal |
| $C(x_k), 1 \leq x_k \leq M$; | | remaining path metric at $(x_k)$ terminal |
| $l(x_k), 1 \leq x_k \leq M$; | | instantaneous frequency of PAL pertaining to remaining path metric at $(x_k)$ terminal |
| $u(x_k), 1 \leq x_k \leq M$; | | output phase of PAL pertaining to remaining path metric at $(x_k)$ terminal |
| $u(x_k), 1 \leq x_k \leq M$; | | carrier phase error of PAL pertaining to remaining path metric at $(x_k)$ terminal |
| M | ; | the number of state | and the initial values of each value is as follows;
k=0
$x(x_o)=x_o$; x(m) is optional except $m=x_o$
$C(x_o)=0$ ; C(m)=$ except $m=x_o$
$l(m)=0, 1 \leq m \leq M$
$u(m)=0, 1 \leq m \leq M$
$u(m)=0, 1 \leq m \leq M$ Next, the branch metrical g defined the following formula will be calculated to all transitions u $k(x_{k+1}, x_k)$ The difference between the input signal $z_k$ which is the vector on the complex plane and each reference signal $r_k$ is numerated to obtain the branch metric.

The expressions g [$u_k(x_{k+1}, x_k)$] will be expressed abbreviately as g $(x_{k+1}, x_k)$, and this will be done similar to other parameters.

$$g(x_{k+1}, x_k) = \| x_{k+1} - r(x_{k+1}, x_k) \| \quad (1)$$

wherein, $$Cl(x_{k+1}, x_k) = r(x_{k+1}, x_k)/d(x_k) \quad (2)$$

$$d(x_k) = u(x_k) + 2PTf(x_k) \quad (3)$$

Here, d designates the shift amount, and the origin signal $r(x_{k+1}, x_k)$ is shifted by d.

This origin signal $r(x_{k+1}, x_k)$ is used as the reference signal for calculating the branch metric.

As described above, when calculating the branch metric in the present embodiment, the value obtained by shifting the carrier phase of the origin signal (reference signal) is used, and the shift amount d is controlled by the carrier phase error u as described later.

Next, the path metric candidates $C(x_{k+1}, x_k)$ in the time (k+1) through all the transitions are calculated, by adding the calculated path metric g $(x_k)$ in the time k to the branch metric g obtained in the above described step.

$$C(x_{k+1}, x_k) = C(x_k) + g(x_{k+1}, x_k) \quad (4)$$

Next, the state $x_{k+1}$, and the path metric C $(x_{k+1})$ will be calculated through each state $x_k$ on the basis of the following formula with the calculated path metric candidate $C(x_{k+1}, x_k)$ $$C(x_{k+1}) = \min [C(x_{k+1}, x_k)] \quad (5)$$

The obtained $x_k$ will be expressed as $\underline{x_k}$. This is the last term of the remaining path in which the state $x_{k+1}$ is its terminal.

$C(x_{k+1})$ and the remaining path $x(x_{k+1})$ corresponded to $C(x_{k+1})$ will be inserted into a certain position in the memory.

Therefore, the time series $(x_k)$ of the state can be obtained.

Next, the phase error $u(x_{k+1})$ of PAL pertaining the remaining path in which $x_{k+1}$ is its terminal, the output phase $(x_{k+1})$, and the instantaneous frequency $f(x_{k+1})$ will be calculated, and each obtained value will be inserted into a certain position in the memory.

$$u(x_{k+1}) = arg(z_{k+1}) - arg(r_{k+1}) \quad (6)$$

$$l(x_{k+1}) = (1-M)f(\underline{x_k}) + (a+b)u(x_{k+1}) - au(\underline{x_k}) \quad (7)$$

$$u(x_{k+1}) = u(\underline{x_k}) + 2PTF(=d(\underline{x_k})) \quad (8)$$

wherein a, b, and M are the positive , and are corresponding to the parameters describing the loop filter of the normal phase synchronizing loop as follows:
 a ; gain of the direct proportion term X loop gain
 b ; gain of the integral proportion term X loop gain M ; leak of the integrator From the formulas (6), (7), and (8), the carrier phase shift amount d is controlled by the carrier phase error u Next, the result from the simulation of the present embodiment will be explained.

Figure 6:
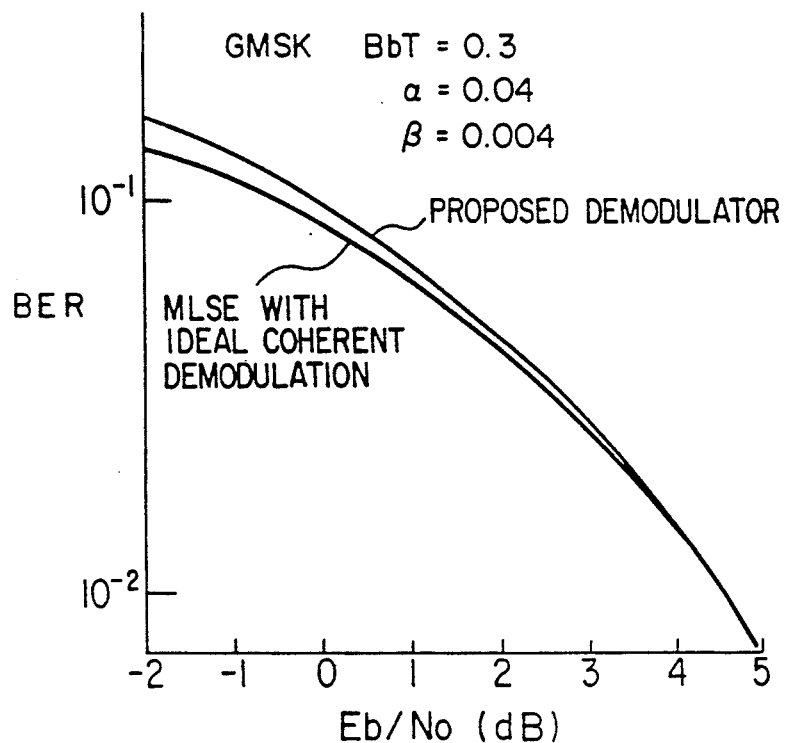
FIG. 6 is a graph showing an error characteristics as a simulation result of the present embodiment.

First, the error rate characteristics will be described. The error rate characteristics in the case wherein the differential coding GMSK (BbT=0.3) is demodulated in accordance with the present invention is shown in FIG. 6 together with the case wherein the maximum likelihood sequence estimation is carried out on the basis of the ideal synchronous carrier (cribbing carrier). In the remarkably low S/N ratio range, a small amount of deterioration is caused in the present invention as compared with the maximum likelihood sequence estimation using the ideal synchronous carrier wave, but the deterioration cannot be found in the normally used range exceeding Eb/No=3 dB. Therefore, it can be said that the present embodiment provides the demodulation system which is capable of operating satisfactorily in the low S/N ratio.

Figure 7:
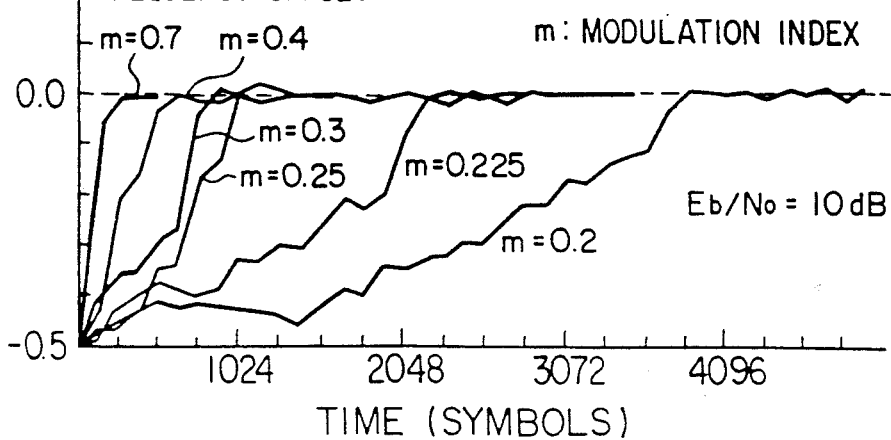
FIGS. 7 through 9 are graphs showing the phase synchronous characteristics of the present embodiment.
Figure 8:
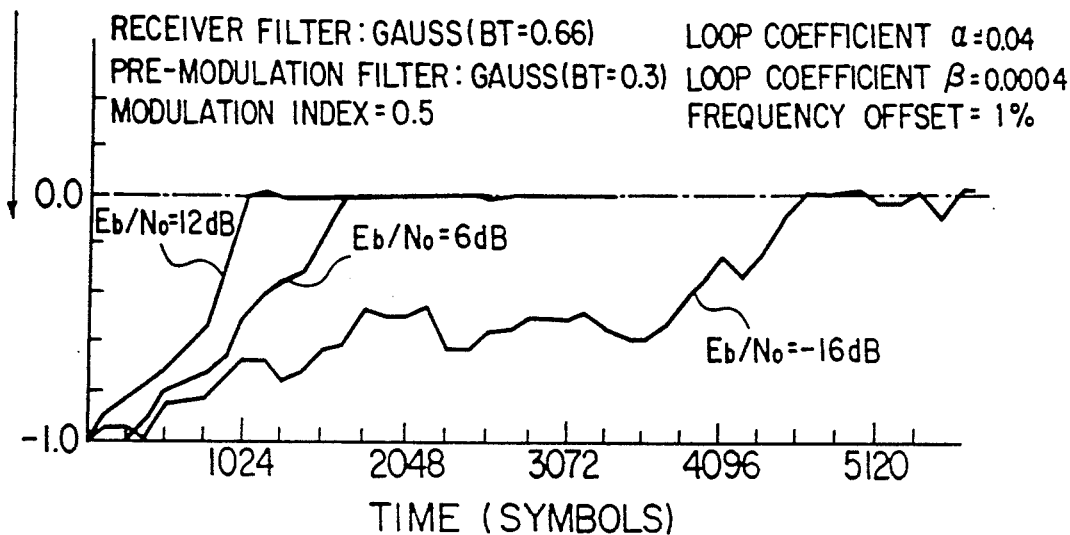
Figure 9:
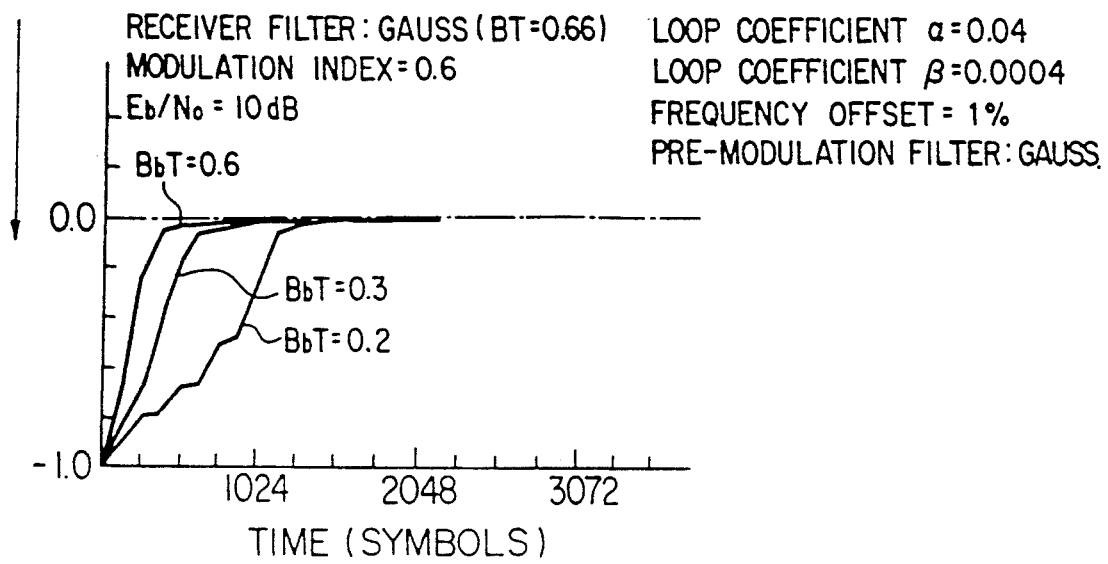

Next, the synchronous characteristics will be explained. The carrier phase synchronous characteristics of the CPM system of the present embodiment is shown in FIGS. 7, 8 and 9. FIGS. 7, 8 and 9 show the synchronous steps on utilizing each modulation index, Eb/No, and the bandwidth of the filter before FM modulation indicating the length of the coherent among the codes as the parameter. In these figures, it can be confirmed that the phase synchronization and series estimation can be carried out satisfactorily in the wide S/N range until about −2 dB in Eb/No and in large coherent among the codes. Further, it can be known from these figures that the phase synchronous characteristics at high speed can be obtained when the modulation index is larger, the S/N ratio is larger and the coherent among the codes is smaller.

In the embodiment shown in FIGS. 4 and 5 as described above, the carrier phase of the input signal is shifted in calculating the branch metric. On the contrary, it is possible to calculate the branch metric by shifting the carrier phase of the reference signal, not the input signal.

Figure 10:
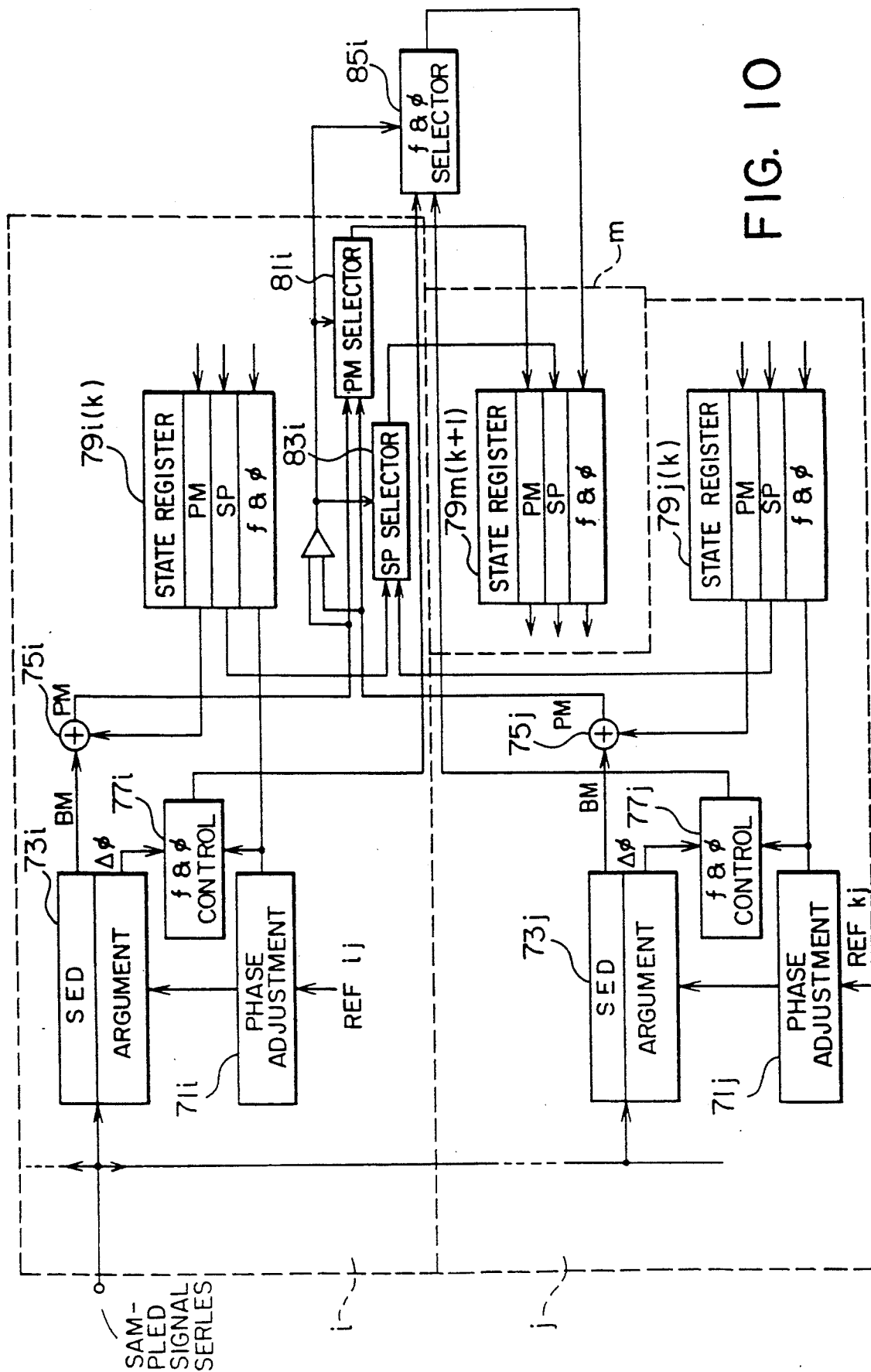
FIG. 10 is a block diagram showing another structure of the Viterbi algorithm arithmetic part 68 in FIG. 3.

FIG. 10 is a block diagram showing the structure of the Viterbi algorithm arithmetic part 68 of the carrier phase synchronous type maximum likelihood decoder for calculating the branch metric after the carrier phase of reference signal is shifted.

The different point between FIG. 10 and FIG. 5, is that the origin signal $r_{ef}$ and the phase shift amount are input into the carrier phase adjusting part 71$i$, and the output of the carrier phase adjusting part 71$i$ is output to the branch metric calculate part 73$i$.

Next, further another embodiment will be explained.

Figure 11:
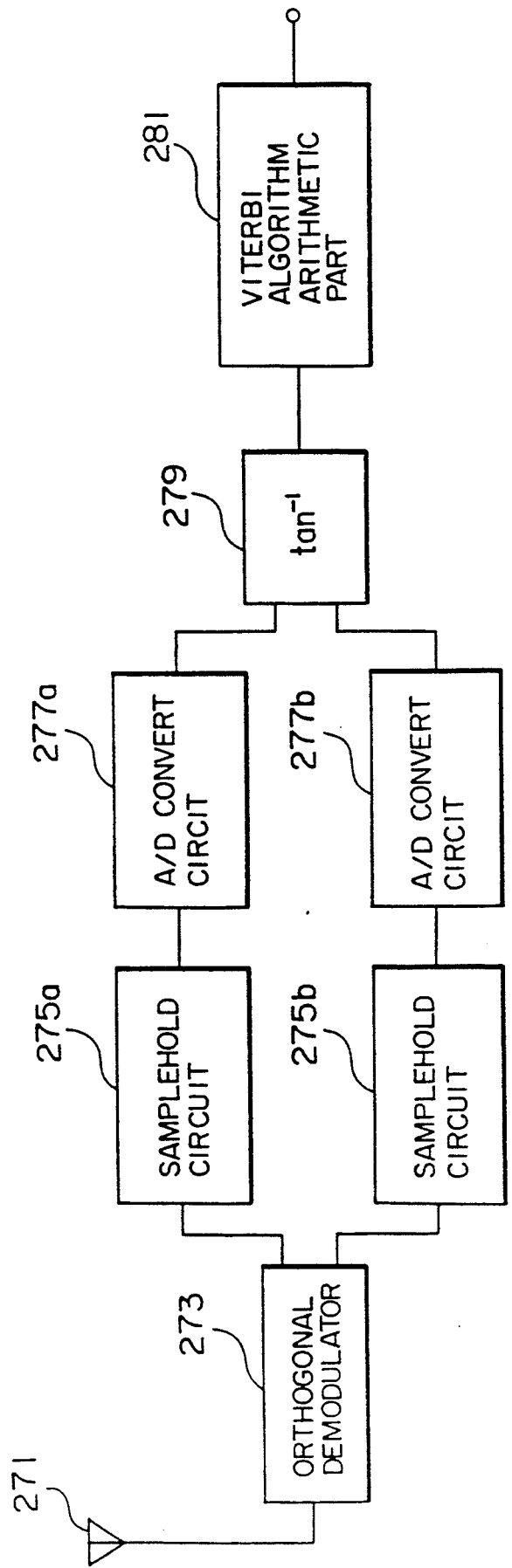
FIG. 11 is a block diagram showing the structure of the receive unit using the Viterbi algorithm.

FIG. 11 is a block diagram showing the structure of the receive device having the Viterbi algorithm carrier phase synchronous type maximum likelihood decoder. The receive device includes an antenna 271, an orthogonal demodulator 273, sample hold circuits 275$a$ and 275$b$, analog-digital convert circuits (A/D converter) 277$a$ and 277$b$, an angle convert circuit (tan$_{-1}$) 279 and a Viterbi algorithm arithmetic part 281.

The receive device of FIG. 11 is effective for the modulation system relating to the phase of CPESK, MPSK and MSK etc.

The orthogonal demodulator 273 demodulates orthogonally the signal received in the antenna 271 by using the asynchronous carrier generated in the built-in local generator (not shown), and transmits two channels of signals (I channel and Q channel) to the samplehold circuit 275$a$ and 275$b$. The samplehold circuits 275$a$ and 275$b$ samplehold the signal transmitted from the orthogonal demodulator 273. The analogdigital convert circuits 277$a$ and 277$b$ convert the analog signals transmitted from the samplehold circuits 275$a$ and 275$b$ into the digital signals. The angle convert circuit 279 converts the signals transmitted from the analog-digital circuits 277$a$ and 277$b$ into the signals indicating the carrier phase, in order to make the amount remarkably small in calculating the carrier phase shift amount. The Viterbi algorithm arithmetic part 281 proceeds the arithmetic of the Viterbi algorithm described later to the signal indicating the phase transmitted from the angle convert circuit 279.

Figure 12:
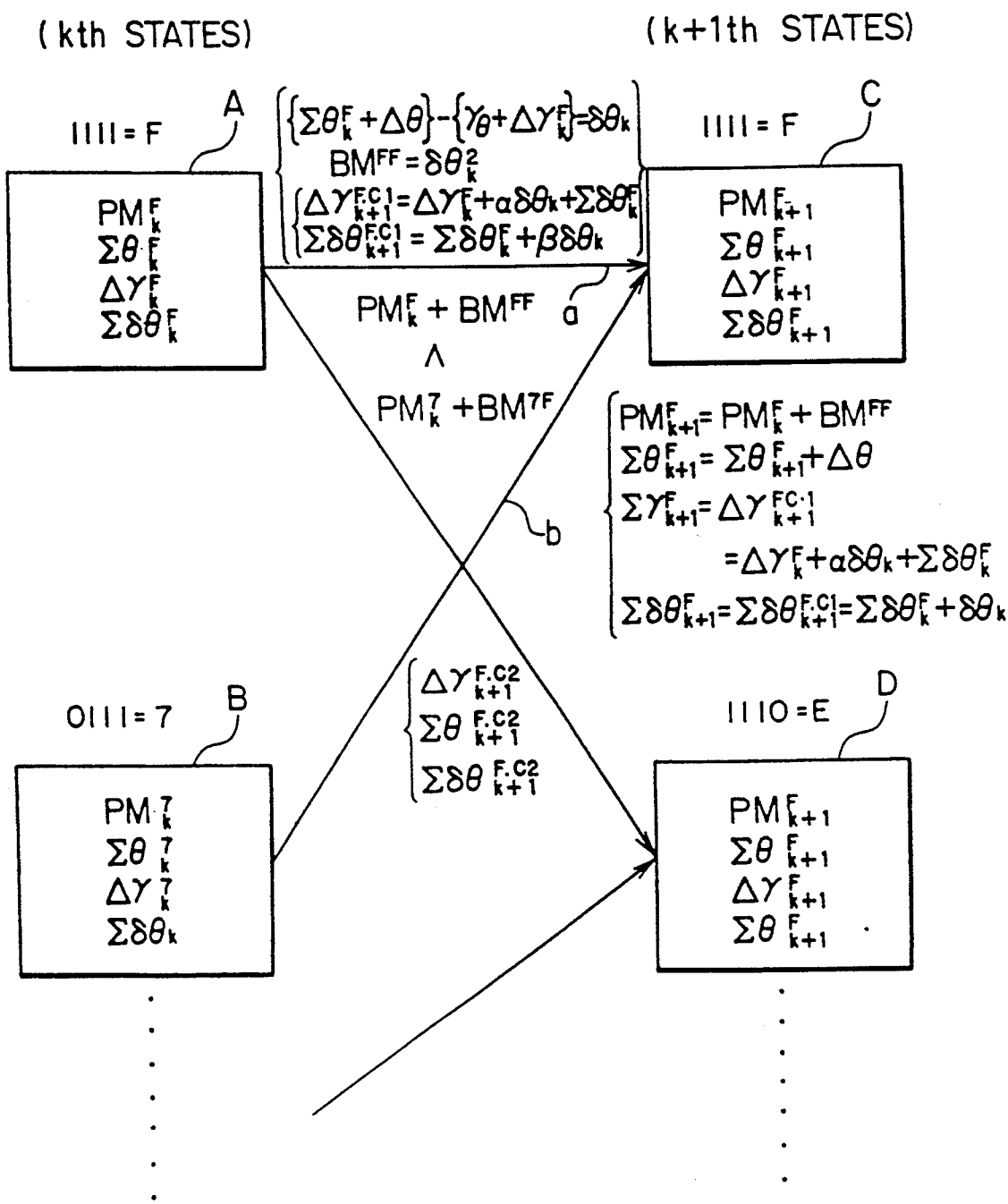
FIG. 12 is a view showing the algorithm of the Viterbi algorithm on the basis of the state transition diagram.

FIG. 12 is a state transition diagram showing the Viterbi algorithm used in the present embodiment.

The states A, B, C and D in the Viterbi algorithm have the state value, such as, the path metric (PM), the accumulated reference phase, the phase shift amount Dr and the accumulated frequency. These values are memorized in the memory during the arithmetic.

The states A and B indicate the difference states in the time k. The state A is "F" (=1111) and the state B is "7" (=0111). And the states C and D indicate the different states in the time k+1. The state C is "F" (=1111) and the state D is "E" (=1110).

The suffix corresponding to each state is attached to the above described path metric (PM) and the accumulated reference phase Rr etc. For example PM$_k$ designates the Fth state in the time k, namely, the path metric in the state A.

In this algorithm, the cattier phase transition amount Dr is used as the reference of the ideal input signal when transited from the "state $k$" to the "state $k$".

In the conditions A and B, the path metric PM, the accumulated reference phase Rr, the carrier phase shift amount r, and the accumulated frequency Rur are already obtained and memorized in the memory.

Next, the branch metric BM will be calculated. The branch metric BM is obtained by evaluating the difference between each reference signal and the input signal in the time k which is the vector on the complex plane.

In the present embodiment, the accumulated reference phase Rr stored in the state which is a start point of the branch is added to the ideal phase transition amount Dr (D r=P/2 when it is from "1111" to "1111" in the GMSK) caused when the branch is selected. As the input signal, the input signal r added with the phase shift amount D $r^F$ is used. Namely, the input carrier phase signal rr is shifted by the carrier phase shift amount Dr$^F$.

The input carrier phase signal rr is transmitted from the angle convert circuit 279 to the Viterbi algorithm arithmetic part 281.

The carrier phase error can be obtained by the following arithmetic.

$$(Rr_k + Dr) - (rr + Dr_k) = Zr_k \qquad (9)E8$$

Next, the branch metric BM$^{FF}$ can be obtained in accordance with the following formula from the obtained carrier phase error.

$$BM_{FF} = Zr_k \qquad (10)$$

Further, the carrier phase shift amount D r and the accumulated frequency RZr will be adjusted by the following formula.

$$Rr_{k+1} = D\ r_k + aZr_k + RZr_k \quad (11)$$

$$RZr_{k+1} = RZr_k\ bZr_k \quad (12)$$

Here, the suffix C1 designates the candidate when the branch a is selected, and the suffix C2 designates the candidate when the branch b is selected.

Next, the path to the state C will be selected by the ACS (Add Compare Select) arithmetic.

In the figure, as the paths to the state C, there exist the path from the state A to the state C, and the path from the state B to the state C. The probability from the state A to the state C is obtained by adding the path metric $PM_k$ of the state A to the branch metric $BM^{FF}$ selecting the branch from the state A to the state C. Namely, the path metric of the state C passing through the branch a to the state C becomes $PM^k + BM^{FF}$. On the contrary, the path metric of the state C passing through the branch b to the state C becomes $PM_n + BM^{7F}$ Next, it is determined which branch is selected from the branch a and b by comparing the sum of the path metric candidate and the branch metric as obtained above.

Here, if $PM_k + BM^{FF} < PM_k + BM^{7F}$, it is considered that the state C is transited from the state A through the branch a (in this case, it is made to select the smaller path metric).

Therefore, in the state C, the path metric PM, the accumulated reference phase Rr, the carrier phase shift amount Rr, and the accumulated frequency RZr can be obtained by the following formula.

$$PM_{k+} = PM_k + BM^{FF} \quad (13)$$

$$Rr_{k+1} = Rr_{k+1} + Dr \quad (14)$$

$$Rr_{k+1} = D\ r_{k+1} = D\ r_k + aZr_k + RZr_k \quad (15)$$

$$RZr_{k+1} = RZr_k + Zr \quad (16)$$

As described above, the new carrier phase shift amount can be selected in the carrier phase shift amount candidates.

The maximum likelihood sequence estimation as mentioned above is carried out sequentially in every time.

The present invention allows the other variations.

For example, the secondary loop control utilizing the primary loop filter is used in the above described embodiment. It is also possible to utilize the primary or exceeding the tertiary.

For the application of the present invention, the arithmetic of the ACS can be achieved by using the software or the hardware in the processor.

Further, the modulated signals which are capable of being utilized in the present invention, are the convolution coded signal, the coded modulation signal, and the linear modulations GMSK, CPFSK and CQPSK etc. including the convolutionally coded QAM, PSM, and ISI. can be obtained.

What is claimed is:

1. A carrier phase synchronous type maximum likelihood decoder for estimating a maximum likelihood sequence of data, said data being transmitted from a transmit side, by following a transition and synthesizing partial series, states i (i = 1, ..., m) in times k (k = 1, ..., n) providing a basis for indicating a partial series of said sequence of data; a transition being from a certain state in time k to another state in time (k+1);

said carrier phase synchronous type maximum likelihood decoder comprising for each state i (i = 1, ..., m):

a memory means for memorizing a path metric and carrier phase shift amount in time k, a carrier phase adjust means for shifting a carrier phase of a signal input in time (k+1) by said carrier phase shift amount memorized in said memory means, a branch metric calculate means for calculating a branch metric by evaluating a difference between an output signal of said carrier phase adjust means and a reference signal, a carrier phase error calculate means for calculating a carrier phase error which is an angle difference between said output signal of said carrier phase adjust means and said reference signal, a carrier phase shift amount calculate means for calculating a carrier phase shift amount candidate for a successor state in time (k+1) on the basis of said carrier phase error and said carrier phase shift amount memorized in said memory means, a path metric candidate calculate means for calculating a path metric candidate for a successor state in time (k+1) on the basis of said path metric memorized in said memory means and said branch metric from said branch metric calculate means;

said carrier phase synchronous type maximum likelihood decoder further comprising:

a path metric selecting means for selecting a path metric for a successor state in time (k+1) by comparing two said path metric candidates calculated by said path metric candidate calculate means, one of which corresponds to a transition from state i in time k to a successor state in time (k+1) and the other of which corresponds to a transition from a state other than i in time k to the successor state in time (k+1), and a carrier phase shift amount select means for selecting a first carrier phase shift amount from two carrier phase shift amounts, said first carrier phase shift amount corresponding to a selected transition which said path metric select means selects.

2. A carrier phase synchronous type maximum likelihood decoder for estimating a maximum likelihood sequence of data, said data being transmitted from a transmit side, by following a transition and synthesizing partial series, states i (i = 1, ..., m) in time k (k = 1, ..., n) providing a basis for indicating a partial series of said sequence of data; a transition being from a certain state in time k to another state in time (k+1);

said carrier phase synchronous type maximum likelihood decoder comprising for each state i (i = 1, ..., m):

a memory means for memorizing a path metric and carrier phase shift amount in time k, a carrier phase adjust means for shifting a carrier phase of reference signals by said carrier phase shift amount memorized in said memory means, a branch metric calculate means for calculating a branch metric by evaluating a difference between an input signal in time (k+1) and the output signal of the carrier phase adjusting means, a carrier phase error calculate means for calculating a carrier phase error which is an angle difference between said input signal in time (k+1) and the output signal of said carrier phase adjust means, a path metric candidate calculate means for calculating a path metric candidate for a successor state in time (k+1) on the basis of said path metric memorized in said memory means and said branch metric from said branch metric calculate means, said carrier phase synchronous type maximum likelihood decoder further comprising:

a path metric selecting means for selecting a path metric for a successor state in time (k+1) by comparing two said path metric candidates calculated by said path metric candidate calculate means, one of which corresponds to a transition from state i in time k to a successor state in time (k+1) and the other of which corresponds to a transition from a state other than i in time k to the successor state in time (k+1), and a carrier phase shift amount select means for selecting a first carrier phase shift amount from two carrier phase shift amounts, said first carrier phase shift amount corresponding to a selected transition which said path metric select means selects.

* * * * *